United States Patent
Ye

(10) Patent No.: US 9,142,806 B2
(45) Date of Patent: Sep. 22, 2015

(54) MASK AND METHOD FOR FORMING THE SAME

(71) Applicants:Xiamen Tianma Micro-Electronics Co., Ltd., Fujian (CN); Tianma Micro-Electronics Co., Ltd., Shenzhen (CN)

(72) Inventor: Tiansheng Ye, Fujian (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/090,923

(22) Filed: Nov. 26, 2013

(65) Prior Publication Data

US 2014/0374381 A1 Dec. 25, 2014

(30) Foreign Application Priority Data

Jun. 21, 2013 (CN) .......................... 2013 1 0250635

(51) Int. Cl.
| | |
|---|---|
| G03F 1/20 | (2012.01) |
| G03F 1/50 | (2012.01) |
| H01L 51/56 | (2006.01) |
| C23C 14/04 | (2006.01) |
| C23C 16/04 | (2006.01) |

(52) U.S. Cl.
CPC .............. *H01L 51/56* (2013.01); *C23C 14/042* (2013.01); *C23C 16/042* (2013.01); *G03F 1/20* (2013.01); *G03F 1/50* (2013.01)

(58) Field of Classification Search
CPC .............. G03F 1/00; G03F 1/20; G03F 1/50; H01L 51/56
USPC ............................... 430/5, 322, 323
See application file for complete search history.

(56) References Cited

U.S. PATENT DOCUMENTS

2013/0071775 A1 3/2013 Prushinskiy et al.
2013/0133573 A1 5/2013 Joo et al.

FOREIGN PATENT DOCUMENTS

| CN | 202534700 U | 11/2012 |
|---|---|---|
| JP | 2004232026 A | 9/2004 |
| TW | I286270 B | 9/2007 |

OTHER PUBLICATIONS

Extended European Search Report for Application No. 13194498.5 mailed on Dec. 12, 2014, 8 pages.
Tseng et al. "Thin Silicon Shadow Masks for Organic Light Emitting Diodes (OLED) Deposition Processes" Smart Structures, Devices, and Systems III, vol. 6414, 6414G, 9 pages (2007).

*Primary Examiner* — Stephen Rosasco
(74) *Attorney, Agent, or Firm* — Alston & Bird LLP

(57) ABSTRACT

A mask is disclosed. The mask includes at least one support base having at least one opening formed therein, where at least a portion of the boundary of the opening is tapered. The mask also includes at least one positioning layer disposed on the at least one support base, where at least one through opening corresponding to and aligned with the at least one opening is formed in the at least one positioning layer. In addition, at least a portion of the boundary of the through opening is tapered.

12 Claims, 7 Drawing Sheets

MASK AND METHOD FOR FORMING THE SAME

CROSS-REFERENCES TO RELATED APPLICATIONS

The present application claims the benefit of priority to Chinese patent application No. 201310250635.2, entitled "MASK AND METHOD FOR FORMING THE SAME", filed with the Chinese Patent Office on Jun. 21, 2013, the content of which is incorporated herein by reference in its entirety.

FIELD OF THE DISCLOSURE

The present disclosure generally relates to display technology, and more particularly, to a mask and a method for forming the same.

BACKGROUND OF THE INVENTION

Organic Light Emitting Diodes (OLED), as they have advantages of wide viewing angle, high contrast ratio and high response speed, etc, has drawn more and more attention. An OLED typically includes a first electrode, an organic light emitting layer and a second electrode. Currently, an organic light emitting layer of an OLED is generally formed by an etching process, in which an organic light emitting material is deposited on a substrate through evaporation for forming the organic light emitting layer. Such process needs a high resolution mask. To reduce production cost, a thin mask is a general choice. Further, to achieve a high resolution and high control accuracy, an opening with a mini-size may be needed to be formed in the mask. However, the conventional etching process has the following disadvantages: 1, because the mask is very thin, it is difficult to accurately control the size and location of the openings and to form the openings with a small size; 2, it is difficult and costly to manufacture a thin type mask, and the thin type mask has a relatively short lifetime.

BRIEF SUMMARY OF THE INVENTION

One inventive aspect is a mask. The mask includes at least one support base having at least one opening formed therein, where at least a portion of the boundary of the opening is tapered. The mask also includes at least one positioning layer disposed on the at least one support base, where at least one through opening corresponding to and aligned with the at least one opening is formed in the at least one positioning layer, and where at least a portion of the boundary of the through opening is tapered.

Another inventive aspect is a method of forming a mask. The method includes providing a support base having first and second opposing surfaces, and forming a first photoresist layer on the first surface of the support base. The method also includes forming at least one through opening in the first photoresist layer so as to form a positioning layer, and etching the second surface of the support base to form at least one opening corresponding to the through opening in the positioning layer.

DETAILED DESCRIPTION OF THE INVENTION

According to a first embodiment, a mask 100 and a method for forming the mask 100 are illustrated in accordance with FIG. 1 to FIG. 4(f).

Figure 1:
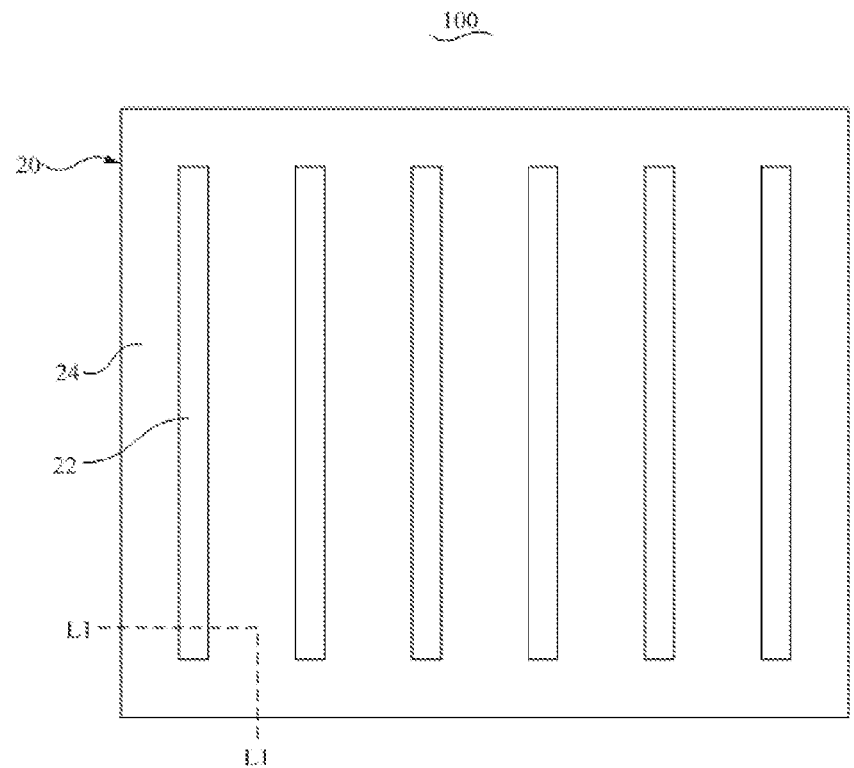
FIG. 1 schematically illustrates a top view of a mask according to a first embodiment of the present invention.
Figure 2:
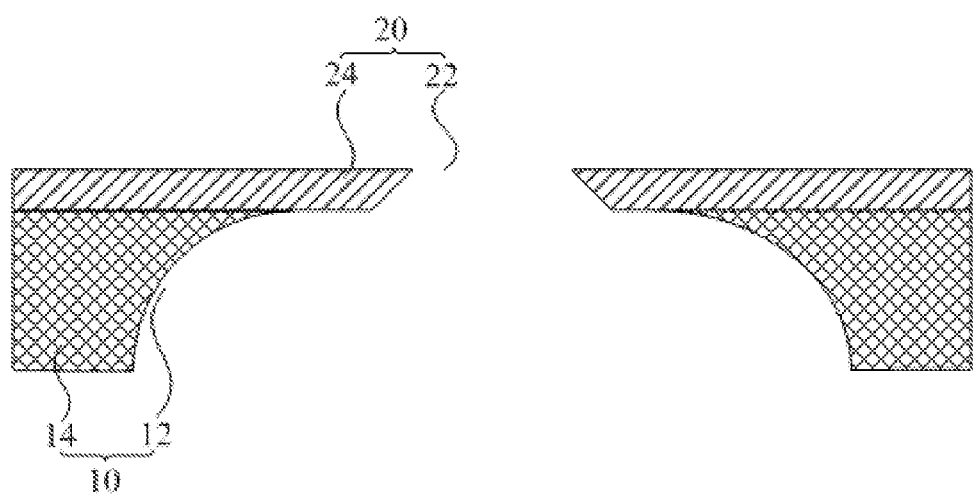
FIG. 2 schematically illustrates a cross-sectional view along the line L1-L1 of FIG. 1.

Referring to FIG. 1 and FIG. 2, FIG. 1 schematically illustrates an overall structure of a mask 100. Because FIG. 1 is a top view, only a positioning layer 20 is shown in FIG. 1. FIG. 2 schematically illustrates a cross-sectional view along the line L1-L1 of FIG. 1, which is a partial cross-sectional view of the mask 100.

In some embodiments, the mask 100 may include a support base 10 and the positioning layer 20. The support base 10 may include nickel iron alloy, i.e. Invar alloy, and may have a thickness ranging from 30 μm to 60 μm, preferably, 40 μm. A plurality of openings 12 are formed in the support base 10. Apart from the openings 12, the remaining part of the support base 10 is solid and defined as a first base 14. The plurality of openings 12 may have substantially arc-shaped cross section. Referring to FIG. 2, the cross section is defined by cutting in a direction from the top to the bottom of the support base 10.

In some embodiments, the positioning layer 20 may be adhered onto the support base 10. The positioning layer 20 is a high polymer material, which can withstand a temperature over 180° C. For example, the positioning layer 20 may be made of polyimide, and may have a thickness ranging from 4 μm to 8 μm. The positioning layer 20 may include a second base 24 and a plurality of through openings 22 extending through the positioning layer. The plurality of through openings 22 are formed one-to-one corresponding to the plurality of openings 12 in the support base. The plurality of through openings 22 may be tapered. For example, one or more through openings 22 may have a substantially trapezoidal cross section. Apart from the through openings 22, the remaining part of the positioning layer 20 is solid and defined as a second base 24.

In some embodiments, the widths of the cross sections of the openings 12 and the through openings 22 may reduce gradually in a direction from the support base 10 to the positioning layer 20. And the minimum width of each opening 12 is greater than the maximum width of a corresponding through opening 22.

In some embodiments, the geometry of the cross section of the opening 12 of the support base is not limited to arc-shaped, but may be tapered, for example, to have a substantially trapezoidal cross section or another shaped cross section. The geometry of the cross section of the through opening 22 of the positioning layer is not limited to trapezoidal, may also have a substantially arc-shaped or another shaped cross section.

In the first embodiment, the support base 10 has a single-layer structure, which is not limited thereto. In other embodiments, the support base 10 may has a multi-layer structure as required.

In the first embodiment, the mask 100 includes the support base 10 and the positioning layer 20. The support base 10 including invar alloy is used to support the positioning layer 20, which may enhance the tensile strength of the mask and prolong working lifetime of the mask 100. The positioning layer 20 is disposed on the support base 10. In conclusion, by adding only one layer having a predetermined thickness (i.e. the positioning layer 20 with a thickness ranging from 4 μm to 8 μm), the size, location and maching angle of the opening may be determined more accurately, which may promote the resolution of the mask 100. Therefore, an organic material pattern having a mini-size may be obtained during evaporation, thus improving the evaporation accuracy of the mask 100.

Referring to FIG. 3, and FIG. 4(a) to FIG. 4(f), a method for forming a mask of the first embodiment is provided. For clarity, only one pair of an opening 12 and a corresponding through opening 22, which are communicated to each other, are illustrated in the drawings.

Step S1, a support base 10 which is made of invar alloy and has a thickness of 40 μm is provided, and a preprocessing is performed on the supports base 10. The support base 10 may have a first surface A and a second surface B, both of which are disposed oppositely.

Step S2, the first surface A of the support base 10 is coated with a first photoresist material. In some embodiments, referring to FIG. 4(a), the first surface A of the support base 10 may be cleaned first. Then a polyimide material, which may have a thickness ranging from 4 μm to 8 μm, may be coated on the first surface A of the support base 10 using a roller brush R, so as to form the first photoresist layer 30 on the first surface A. To simplify the process, the first photoresist layer 30 is defined as a negative photoresist.

Figure 4A:
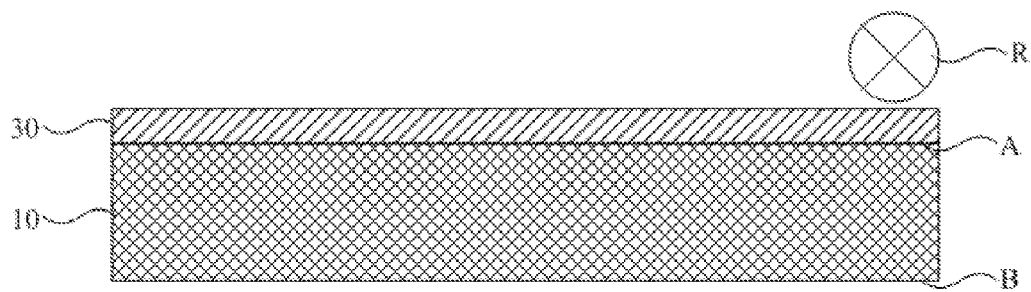
FIG. 4(a) schematically illustrates an intermediate structure of a method for forming the mask in FIG. 1.
Figure 4B:
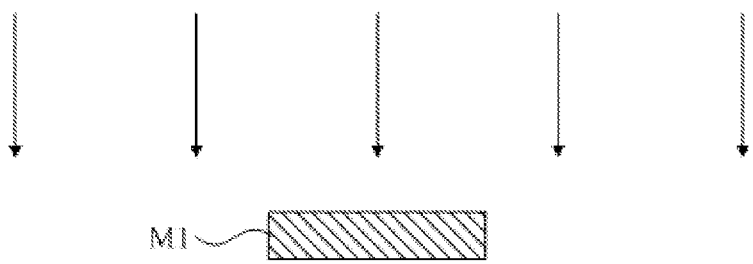
FIG. 4(b) schematically illustrates an intermediate structure of a method for forming the mask in FIG. 1.
Figure 4B:
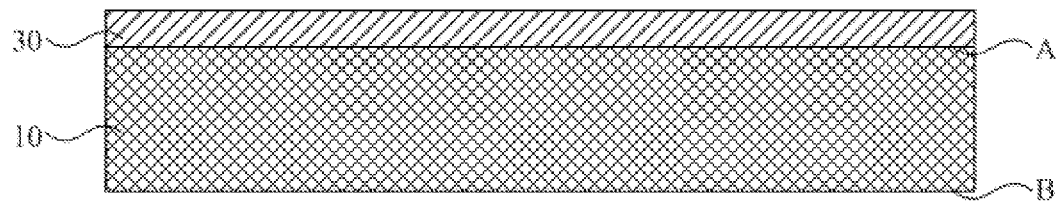
Figure 4C:
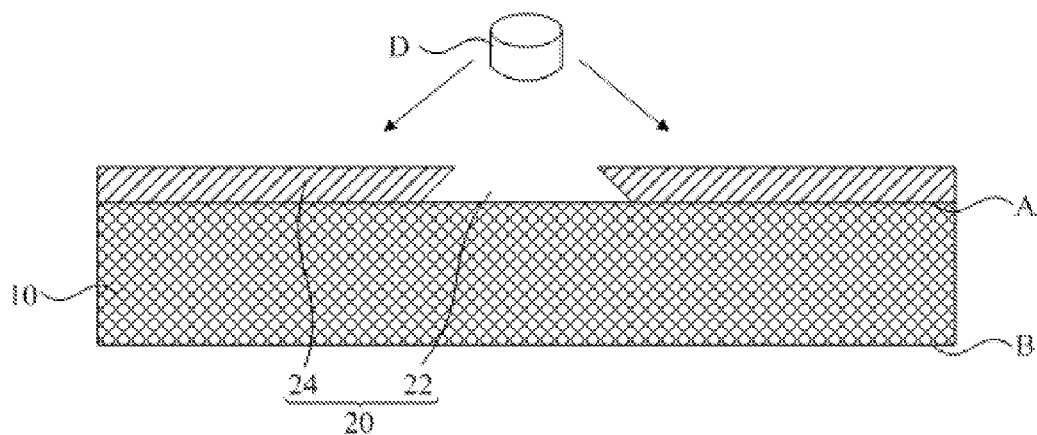
FIG. 4(c) schematically illustrates an intermediate structure of a method for forming the mask in FIG. 1.

Step S3, the first photoresist layer 30 is patterned. Referring to FIG. 4(b) and FIG. 4(c), an exposure, development and baking processes may be performed on the first photoresist layer 30 successively, by using a reticle M1, a development device D and a baking device (not shown), respectively. As the first photoresist layer 30 is a negative photoresist, a through opening 22 is formed at a position corresponding to the reticle M1, so as to form a positioning layer 20. In this embodiment, the through opening 22 is tapered and has a trapezoid shape, so the width of a cross section of the through opening 22 reduces gradually in a direction from the support base 10 to the positioning layer 20.

Step S4, a second photoresist material is coated on the second surface B of the support base 10. In some embodiments, referring to FIG. 4(d), the second surface B of the support base 10 may be cleaned first. Then a second photoresist layer 40 is formed on the second surface B. The second photoresist layer 40 may be an UV photosensitive material and defined as a positive photoresist.

Figure 4D:
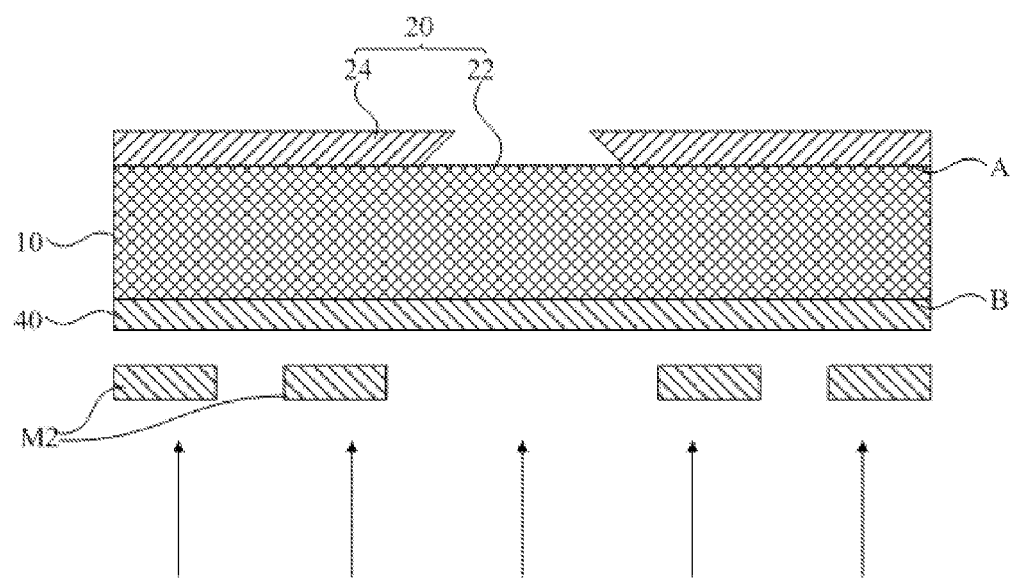
FIG. 4(d) schematically illustrates an intermediate structure of a method for forming the mask in FIG. 1.
Figure 4E:
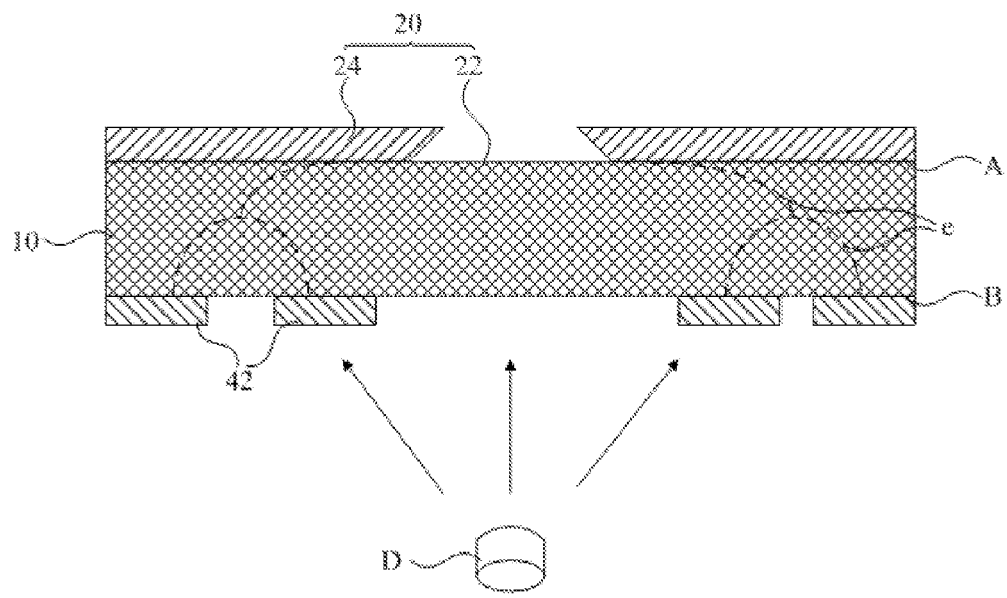
FIG. 4(e) schematically illustrates an intermediate structure of a method for forming the mask in FIG. 1.

Step S5, the second photoresist layer 40 is patterned. Referring to FIG. 4(d) and FIG. 4(e), by using a reticle M2 and a development device D, an exposure process and a development process may be performed on the second photoresist layer 40 successively, so as to form a grating structure on the second surface B. In FIG. 4(e), four gratings 42 constitute the grating structure. In practice, parameters of the grating 42, such as size, number and space between neighboring gratings, may be adjusted according to specific requirements.

Figure 4F:
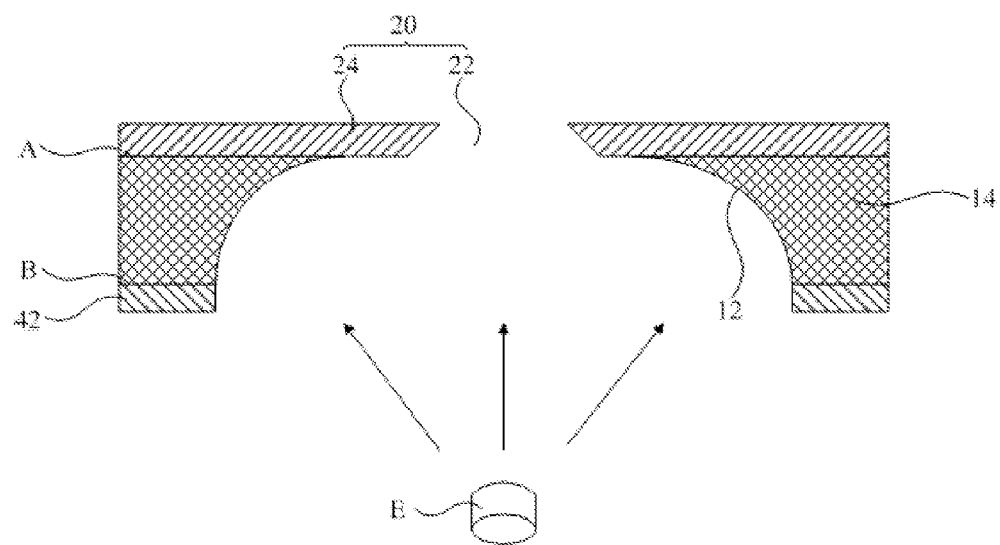
FIG. 4(f) schematically illustrates an intermediate structure of a method for forming the mask in FIG. 1.

Step S6, the second surface B is etched to form an opening 12 extending trough the support base 10. In some embodiments, referring to FIG. 4(e), an etching rate is predetermined, and an etching line e may be designed according to the size, number and space of the gratings 42. An etching device E is used to etch the second surface B along the etching line e, to form an opening 12 in the support base 10. In the overall structure of the mask 100, each of the openings 12 may respectively correspond to and be communicated to each of the through openings 22 in the positioning layer. And the openings 12 are formed under the through openings 22. To avoid over etching and adverse influence on the adhesive force between the positioning layer 20 and the support base 10, the minimum width of the cross section of the openings 12 is designed to be greater than the maximum width of the cross section of the through openings 22. The opening 12 may have a substantially arc-shaped cross section, which has a width that reduces gradually in a direction from the support base 10 to the positioning layer 20. Because FIG. 4(f) is a partial cross-sectional view, only one opening 12 and its corresponding through opening 22 are shown in FIG. 4(f).

Step S7, the grating 42 on the support base 10 is removed to obtain the mask 100.

In order to enhance the adhesive force between the positioning layer 20 and the first surface of the support base 10, a high temperature baking (e.g. above 100° C.) may be used to make the positioning layer 20 adhere more closely to the first surface A.

In the method for forming a mask 100 according to the first embodiment, a polyimide material is coated on the first surface A of the base 10 to form the first photoresist layer 30, and an UV photosensitive material is coated on the second surface B of the base 10 to form the second photoresist layer 40. First, a positioning unit is obtained after an exposure process and a development process are performed on the first photoresist layer 30. Then, a grating structure is obtained after an exposure process and a development process are performed on the second photoresist layer 40. Further, the opening 12 is formed by etching the second surface B, which is communicated to the through opening 22. The process described above for forming a mask is simple and is adapted for mass production.

Figure 5:
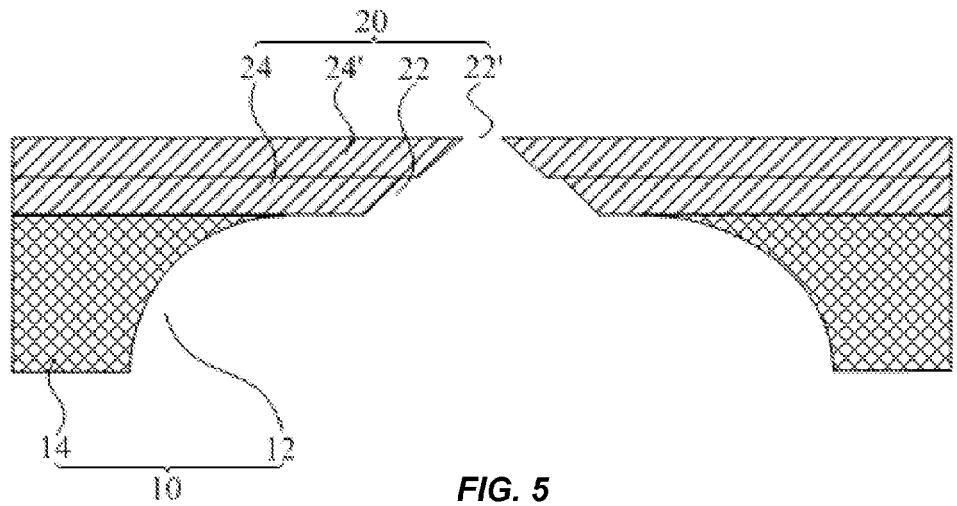
FIG. 5 schematically illustrates a partial cross-sectional view of a mask according to a second embodiment of the present invention.

A second embodiment of a mask is illustrated in accordance with FIG. 5, the main structure of which may be similar to the mask 100 in the first embodiment. In the second embodiment, the positioning layer 20 is a double-layer structure, which includes a first-layer base 24 and an opening 22 corresponding to the first-layer base; and a second-layer base 24' and an opening 22' corresponding to the second-layer base. The opening 22 is communicated to the opening 22'. The opening 22' is formed above the opening 22. The width of a cross section of the opening 22' is smaller than the width of a cross section of the opening 22. In this way, a pattern of an organic light emitting material having a smaller size may be obtained through the opening 22' through evaporation, thus improving the accuracy of the evaporation for forming a light emitting device.

In some embodiments, according to actual requirements, the positioning layer 20 may include more than two layers, which should not be limited to the double-layer structure shown in FIG. 5. All through openings respectively formed in the multiple layers of the positioning layer 20 are communicated to each other. And the width of a cross section of each through opening increases gradually in a direction away from the support base to approaching the support base. Such design may not only allow the mask having a thickness within a reasonable range, but also obtain a through opening having a relatively smaller size, thereby obtaining a pattern of light emitting material having a corresponding small size, further improving the accuracy of the evaporation of the mask.

Figure 6:
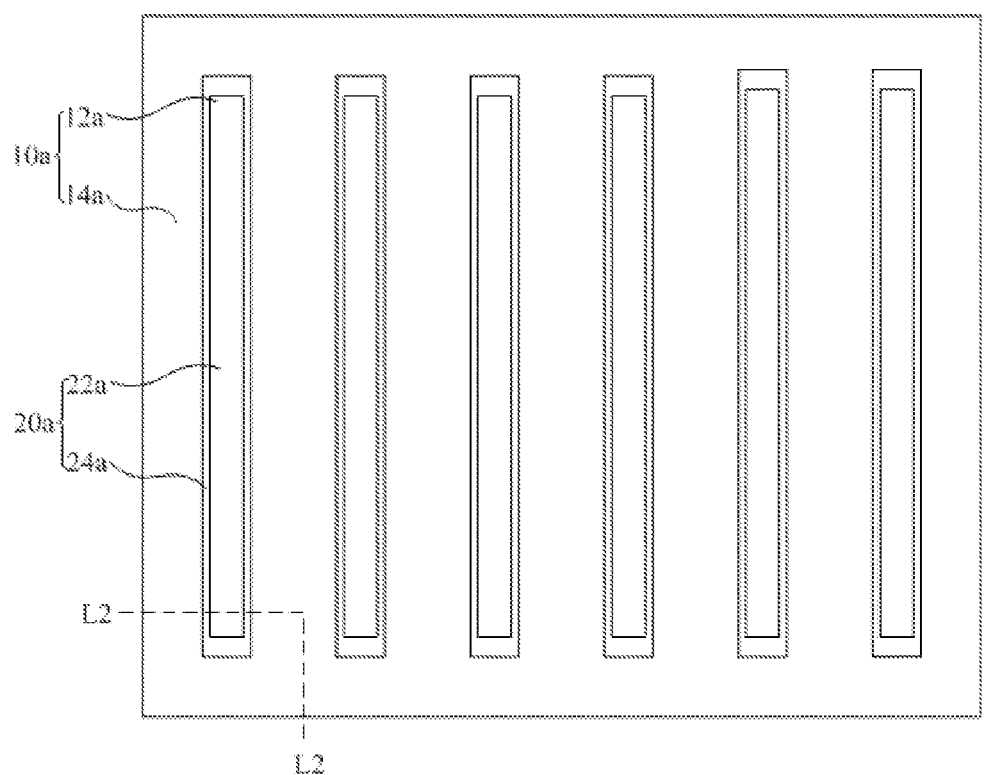
FIG. 6 schematically illustrates a top view of a mask according to a third embodiment of the present invention.
Figure 7:
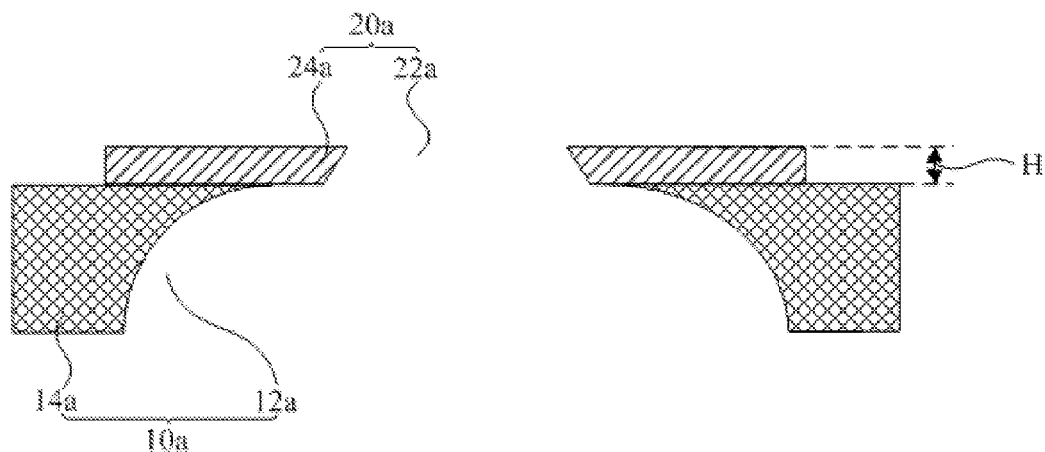
FIG. 7 schematically illustrates a cross-sectional view along the line L2-L2 of FIG. 6.

A third embodiment of a mask 100a is illustrated in accordance with FIG. 6 and FIG. 7.

Referring to FIG. 6 and FIG. 7, FIG. 6 schematically illustrates an overall structure of the mask 100a. FIG. 7 schematically illustrates a cross-sectional view along the line L2-L2 of FIG. 6, which is a partial cross-sectional view of the mask 100a.

The main structure of the mask 100a is substantially the same as the mask shown in the first and second embodiments, which is not described in detail herein. The difference is that the positioning layer 20 of the first and second embodiments is a continuous structure, while a positioning layer 20a of the third embodiment has a plurality of separated structures. Further, a step is formed between the top surface of the positioning layer 20a and the top surface of the support base 10a, which has a height difference H in a longitudinal direction. The step having the height difference H can prevent an organic layer from being crushed by the mask during evaporation.

Figure 3:
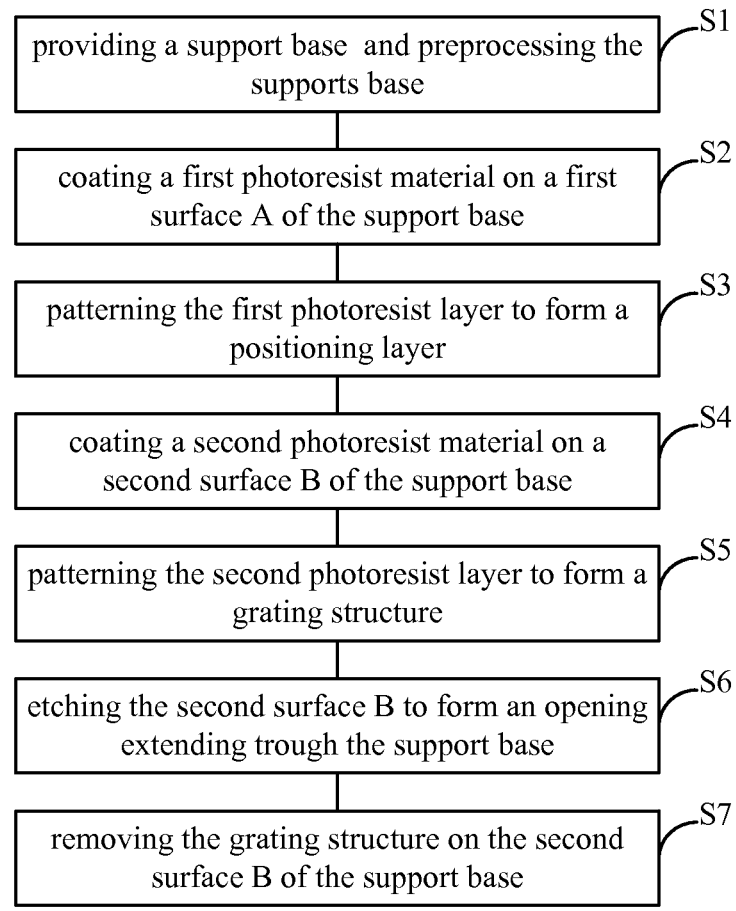
FIG. 3 is a schematic flow chart of a method for forming the mask in FIG. 1 according to one embodiment of the present invention.

A method for forming the mask 100a may be similar to the method for forming the mask 100 shown in FIG. 3. In the method of forming mask 100a, in the step S3, the photoresist layer on the support base 10a is patterned to form multiple separated positioning layers 20a. In some embodiments, a space between neighbouring positioning layers 20a is predetermined. Then, a plurality of separated reticles (not shown) are additionally provided, which may have their locations corresponding to the spaces of the multiple separated positioning layers 20a. By using the plurality of additional reticles, the photoresist layer on the support base 10a is divided into multiple separated photoresist layers through exposure and development processes. Then, a through opening 22a is formed in each separated photoresist layer, such that a plurality of separated positioning layers 20a are obtained.

According to the third embodiment, a modified structure of the mask is provided. The positioning layers 20a having a plurality of separated structures is formed on the support base 10a, such that a step is formed between the top surface of the positioning layer 20a and the top surface of the support base 10a, which has a height difference H in a longitudinal direction. The step having the height difference H can prevent an organic layer from being crushed by the mask during evaporation.

Figure 8:
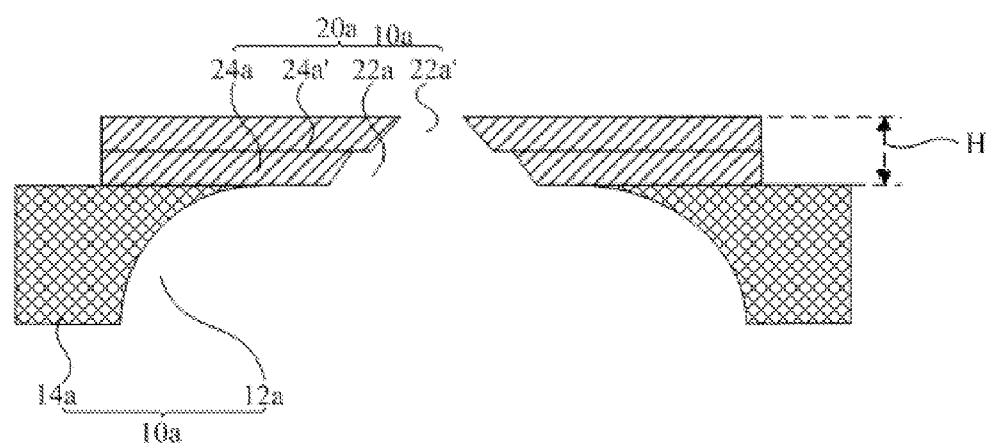
FIG. 8 schematically illustrates a partial cross-sectional view of a mask according to a fourth embodiment of the present invention.

A fourth embodiment of a mask is illustrated in accordance with FIG. 8, the main structure of which may be similar to the mask 100a of the third embodiment. In the third embodiment, the positioning layer 20a is a double-layer structure, which includes a first-layer base 24a and an opening 22a corresponding to the first-layer base 24a, and a second-layer base 24a' and an opening 22a' corresponding to the second-layer base 24a'. The opening 22a is communicated to the opening 22a'. The opening 22a' is formed above the opening 22a. The width of a cross section of the opening 22a' is smaller than the width of a cross section of the opening 22a. In this way, a pattern of an organic light emitting material having a relatively smaller size may be obtained through the opening 22a' during evaporation, thus improving the accuracy of the evaporation for forming a light emitting device.

Likewise, in some embodiments, the positioning layer 20a may include more than two layers, which should not be limited to the double-layer structure shown in FIG. 8. All through openings respectively formed in the multiple layers of the positioning layer 20a are communicated to each other upper and lower. And the width of a cross section of each through opening increases gradually in a direction away from the support base to approaching the support base. Therefore, a through opening having a relatively smaller size can be obtained, thereby improving the accuracy of the evaporation of the mask.

Although certain features have been disclosed above with reference to specific embodiments, it should be understood that the disclosure is presented by way of example only, and not limitation. Those skilled in the art can modify and vary the embodiments without departing from the spirit and scope of the present disclosure.

The invention claimed is:

1. A mask, comprising:
   at least one support base having at least one opening formed therein, wherein at least a portion of the boundary of the opening is tapered; and
   at least one positioning layer only disposed on a top surface of the at least one support base, wherein at least one through opening corresponding to and aligned with the at least one opening is formed in the at least one positioning layer, and wherein at least a portion of the boundary of the through opening is tapered.

2. The mask according to claim 1, wherein a width of a cross section of the opening in the support base is greater than a width of a corresponding through opening in the positioning layer.

3. The mask according to claim 1, wherein the positioning layer is a multi-layer structure, and the through openings in the multi-layer positioning layer are aligned, and a width of a cross section of the through opening in the multi-layer positioning layer increases along a direction from the positioning layer toward the support base.

4. The mask according to claim 1, wherein the positioning layer is a continuous structure, and is disposed such that the at least one opening in the support base is aligned with the at least one through opening in the positioning layer.

5. The mask according to claim 1, wherein the positioning layer has a plurality of separated parts, each of which is disposed such that a particular opening in the support base is aligned with a corresponding through opening in the positioning layer.

6. The mask according to claim 5, wherein a step is formed between a top surface of the positioning layer and a top surface of the support base, which has a height difference in a longitudinal direction.

7. The mask according to claim 1, wherein a cross section of each of a plurality of openings in the support base and a cross section of each of a plurality of through openings in the positioning layer is substantially arc-shaped or trapezoid.

8. The mask according to claim 1, wherein the material of the support base comprises invar alloy.

9. The mask according to claim 1, wherein the support base has a thickness between about 30 μm and about 60 μm.

10. The mask according to claim 1, wherein the positioning layer has a thickness between about 4 μm and about 8 μm.

11. The mask according to claim 10, wherein the material of the positioning layer comprises polyimide.

12. The mask according to claim 1, wherein the at least one support base has a greater thickness, and a greater rigidity than the at least one positioning layer.

* * * * *